(12) United States Patent
Kim et al.

(10) Patent No.: US 11,856,742 B2
(45) Date of Patent: Dec. 26, 2023

(54) SELF-CURLING SHIELDING TUBE

(71) Applicant: LS CABLE & SYSTEM LTD., Anyang-si (KR)

(72) Inventors: Chang Suk Kim, Seoul (KR); Young Hoon Yang, Seoul (KR); Un Kyoo Park, Seoul (KR); Chang Eun Cho, Suwon-si (KR)

(73) Assignee: LS CABLE & SYSTEM LTD., Anyang-si (KR)

( * ) Notice: Subject to any disclaimer, the term of this patent is extended or adjusted under 35 U.S.C. 154(b) by 0 days.

(21) Appl. No.: 17/755,734

(22) PCT Filed: Nov. 19, 2019

(86) PCT No.: PCT/KR2019/015898
§ 371 (c)(1),
(2) Date: May 6, 2022

(87) PCT Pub. No.: WO2021/090996
PCT Pub. Date: May 14, 2021

(65) Prior Publication Data
US 2022/0394890 A1    Dec. 8, 2022

(30) Foreign Application Priority Data

Nov. 7, 2019  (KR) .......................... 10-2019-0141348

(51) Int. Cl.
*H05K 9/00* (2006.01)
(52) U.S. Cl.
CPC ........... *H05K 9/009* (2013.01); *H05K 9/0098* (2013.01)

(58) Field of Classification Search
CPC .............................. H05K 9/009; H05K 9/0098
See application file for complete search history.

(56) References Cited

U.S. PATENT DOCUMENTS

| | | | | |
|---|---|---|---|---|
| 4,684,762 | A * | 8/1987 | Gladfelter | D03D 15/00 174/DIG. 11 |
| 6,005,191 | A * | 12/1999 | Tzeng | H01B 11/10 174/110 N |
| 11,219,145 | B2 * | 1/2022 | Cho | H05K 9/0098 |
| 2014/0251490 | A1 * | 9/2014 | Marcellin | D03D 1/0088 28/165 |
| 2014/0262476 | A1 * | 9/2014 | Laurent | H05K 9/0007 174/379 |

(Continued)

FOREIGN PATENT DOCUMENTS

| | | |
|---|---|---|
| CN | 1103447 A | 6/1995 |
| CN | 102443954 A | 5/2012 |
| CN | 105283590 A | 1/2016 |

(Continued)

OTHER PUBLICATIONS

International Search Report for related International Application No. PCT/KR2019/015898; dated May 14, 2021 (5 pages).

(Continued)

*Primary Examiner* — Hung V Ngo
(74) *Attorney, Agent, or Firm* — K&L Gates LLP

(57) ABSTRACT

The present disclosure relates to a self-curling shielding tube for improving workability of connecting or shielding a cable, securing high electromagnetic wave shielding performance, and minimizing weight and costs.

8 Claims, 8 Drawing Sheets

(56) References Cited

U.S. PATENT DOCUMENTS

2018/0287357 A1* 10/2018 Knudson .............. H02G 3/0481
2020/0032430 A1* 1/2020 Verstraeten .......... D03D 1/0058

FOREIGN PATENT DOCUMENTS

| JP | 2007277745 A | 10/2007 |
| JP | 2011089194 A | 5/2011 |
| JP | 2016516907 A | 6/2016 |
| JP | 2017186686 A | 10/2017 |
| KR | 1020030017716 A | 3/2003 |
| KR | 1020040030857 A | 4/2004 |
| KR | 1020180067104 A | 6/2018 |
| KR | 1020180137931 A | 12/2018 |

OTHER PUBLICATIONS

Written Opinion or related International Application No. PCT/KR2019/015898; dated May 14, 2021; (5 pages).

Office Action for related Japanese Application No. 2022-526308; action dated May 9, 2023; (5 pages).

Office Action for related Chinese Application No. 201980101743.9; action dated Sep. 28, 2023; (6 pages).

* cited by examiner

SELF-CURLING SHIELDING TUBE

CROSS-REFERENCE TO RELATED APPLICATIONS

The present application is a National Stage of International Application No. PCT/KR2019/015898 filed on Nov. 19, 2019, which claims the benefit of Korean Patent Application No. 10-2019-0141348, filed on Nov. 7, 2019, filed with the Korean Intellectual Property Office, the entire contents of which is hereby incorporated by reference.

FIELD

The present disclosure relates to a self-curling shielding tube. More specifically, the present disclosure relates to a self-curling shielding tube for improving workability of connecting or shielding a cable, securing high electromagnetic wave shielding performance, and minimizing weight and costs.

In general, a shielding layer may be added for shielding during manufacture of a cable or be added afterward to a cable including no shielding layer or a connection part of the cable.

As a method of adding an electromagnetic wave shielding function to a connection part of a communication cable or the like, a method of covering the connection part of the communication cable with a metal shielding member and welding the shielding member onto a shielding layer of the communication cable or a method of applying a shielding tube, which is a heat shrinkable tube, to the communication cable and performing thermal contraction may be used.

In the former case, connection parts or the like of both communication cables may be covered with a metal braided shielding member and the metal braided shielding member and shielding layers of the communication cables may be welded together to electrically connect the shielding layers, thereby minimizing leakage of electromagnetic waves through the connection parts of the communication cables, but when the metal braided shielding member and the shielding layers of the communication cables are welded together, on-site workability may be low and a reduction of the weights of the cables may be hindered.

In the latter case, a heat shrinkable tube formed of a general resin material is difficult to ensure sufficient rigidity and is likely to be torn. A general heat shrinkable tube is formed of only a resin material and thus has low electromagnetic waves shielding performance. Similar to the method of the former case, the tube should be contracted by applying heat thereto at a cable connection site and thus on-site workability is low. Although there was an attempt to reinforce shielding performance by applying carbon fiber yarn or the like to the heat shrinkable tube, shielding performance was lower than that of a metal shielding layer.

SUMMARY

The present disclosure relates to a self-curling shielding tube for improving workability of connecting or shielding a cable, securing high electromagnetic wave shielding performance, and minimizing weight and costs.

According to an aspect of the present disclosure, the present disclosure is directed to providing a self-curling shielding tube comprising a braided member formed by braiding a plurality of carbon fiber yarn bundles and a plurality of shrinkage parts, the plurality of carbon fiber yarn bundles being obtained by weaving metal-plated carbon fiber yarn, and the plurality of shrinkage parts being disposed perpendicular to the plurality of carbon fiber yarn bundles and including a plurality of shrinkage members formed of shrinkable fibers, wherein the carbon fiber yarn bundles of the braided member are arranged in parallel in a longitudinal direction, the shrinkage parts are arranged in a circumferential direction, and the braided member is formed in a cylindrical shape by thermal contraction and comprises overlapping portions overlapping in the circumferential direction.

And each of the plurality of carbon fiber bundles may comprise 3K, 6K or 12K strands of carbon fiber yarn.

And the carbon fiber yarn of each of the plurality of carbon fiber yarn bundles may comprise PAN-based carbon fiber yarn having an elongation of 1% or more.

And the metal-plated carbon fiber yarn may be formed of copper, gold, silver, aluminum, nickel or an alloy thereof.

And the metal-plated carbon fiber yarn may have a plating density of 2.7 g/cm$^3$ or less.

And the metal-plated carbon fiber yarn of each of the plurality of carbon fiber yarn bundles may have a plating thickness of 0.2 µm to 0.5 µm before weaving.

And the metal-plated carbon fiber yarn of each of the plurality of carbon fiber yarn bundles may a plating thickness of 0.2 µm to 0.4 µm after weaving and braiding.

And the plurality of shrinkage members of the plurality of shrinkage parts may comprise wires formed of a polyolefin resin material.

And the plurality of shrinkage members of the plurality of shrinkage parts may be arranged in a single layer.

And each of the plurality of shrink members may comprise wires formed of the polyolefin resin material and has a diameter of 0.25 mm to 0.5 mm, wherein one to five wires form one shrinkage part.

And an overlapping range of the overlapping portions in the circumferential direction may be a range of 20 to 50 degrees in a state of a cable is not inserted into the self-curling shielding tube.

A self-curling shielding tube of the present disclosure is provided in a self-curling form that is heat-contracted, and thus, welding or thermal contraction using fire or the like is not necessary at a cable work site and a lightweight self-curling shielding tube having high shielding performance can be provided.

The self-curling shielding tube according to the present disclosure can be installed without using fire such as a heat gun after connection of a cable connection part, thereby improving workability of electromagnetic wave shielding work.

In the self-curling shielding tube of the present disclosure, a bundle of metal-plated carbon fiber yarn can be applied in a longitudinal direction to achieve higher shielding performance than when a shielding member, which is a heat shrinkable tube formed of a resin material or carbon fiber yarn, is used.

In addition, according to the self-curling shielding tube of the present disclosure, the bundle of metal-plated carbon fiber yarn can be applied in the longitudinal direction to ensure high shielding performance and greatly reduce weight and costs, compared to when a shielding layer including a metal braided member is used.

DETAILED DESCRIPTION

Hereinafter, embodiments of the present disclosure will be described in detail with reference to the accompanying drawings. The present disclosure is, however, not limited thereto and may be embodied in many different forms. Rather, the embodiments set forth herein are provided so that this disclosure may be thorough and complete and fully convey the scope of the disclosure to those skilled in the art. Throughout the specification, the same reference numbers represent the same elements.

Figure 1:
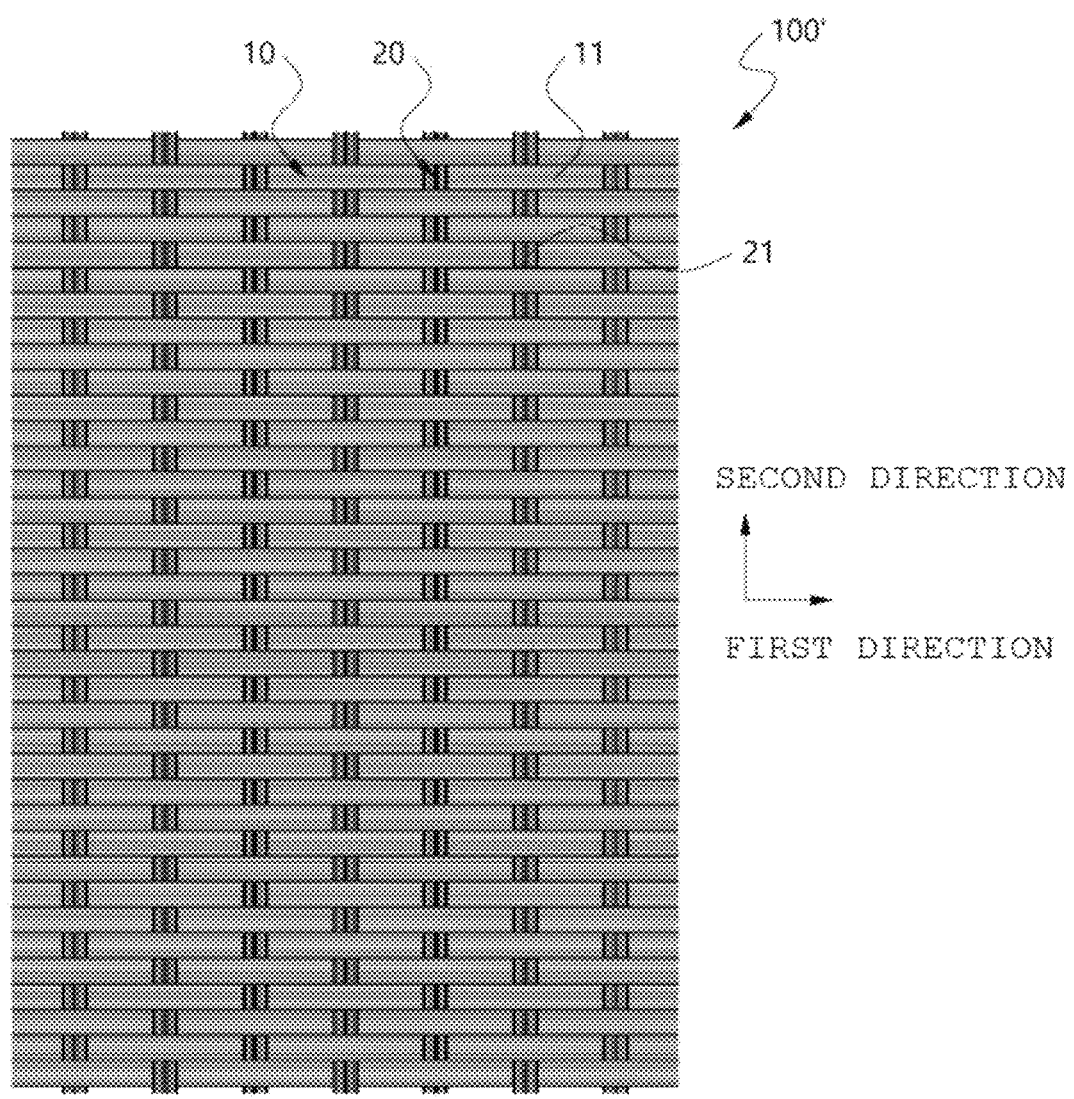
FIG. 1 illustrates a braided member for forming a self-curling shielding tube according to an embodiment of the present disclosure.
Figure 2:
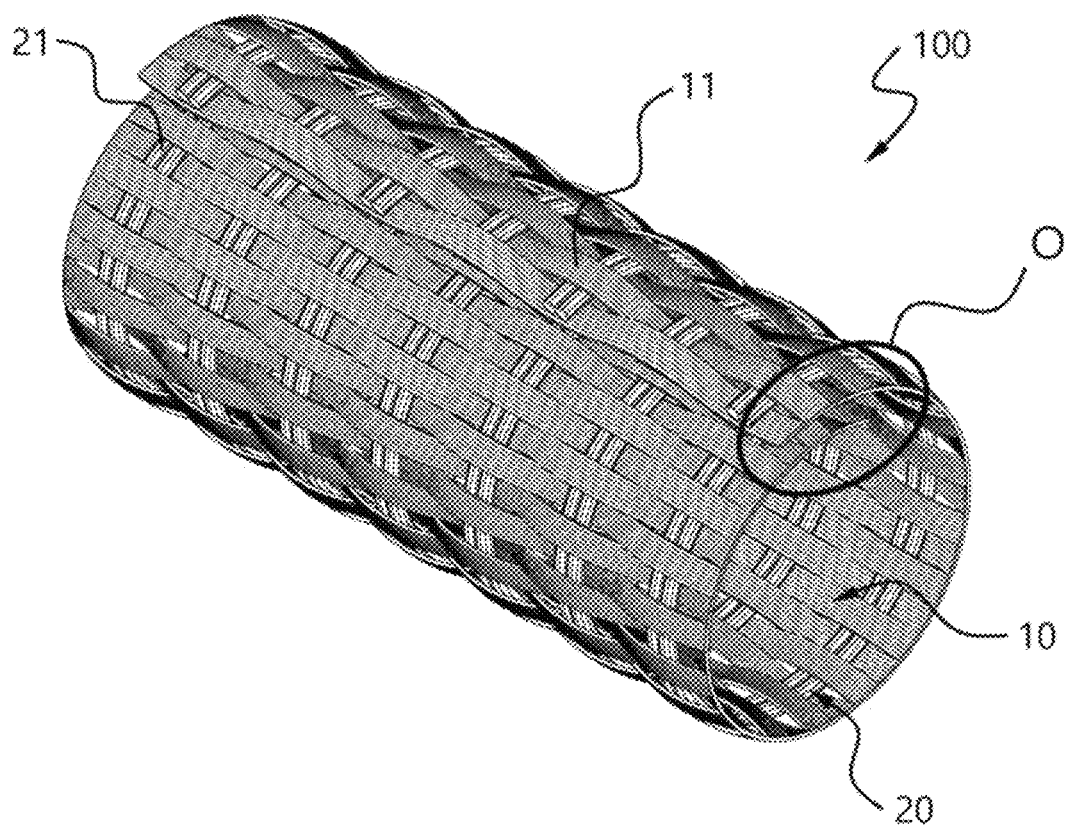
FIG. 2 is a perspective view of a self-curling shielding tube obtained by thermal contraction of the braided member of FIG. 1 in a tubular form.

FIG. 1 illustrates a braided member 100' for forming a self-curling shielding tube 100 according to an embodiment of the present disclosure. FIG. 2 is a perspective view of the self-curling shielding tube 100 obtained by thermal contraction of the braided member 100' of FIG. 1 in a tubular form.

The self-curling shielding tube 100 of the present disclosure may include the braided member 100' formed by braiding carbon fiber yarn bundles 10, which are obtained by weaving metal-plated carbon fiber yarn 11, and shrinkage parts 20 located perpendicular to the carbon fiber yarn bundles 10 and including shrinkage members 21 formed of a shrinkable fiber, and may be formed by arranging the carbon fiber yarn bundles 10 of the braided member 100' in parallel in a longitudinal direction (a first direction), arranging the shrinkage parts 20 in a circumferential direction (a second direction), rolling a resultant structure in a cylindrical shape to form overlapping portions O in the circumferential direction, and thermally contracting the shrinkage parts 20.

A self-curling tube refers to a tube that curls in the circumferential direction due to self-curling characteristics even when no external force is applied thereto and thus both ends thereof in the circumferential direction overlap each other at a certain angle, thus forming overlapping portions. Therefore, a worker may separate the overlapping portions from each other with a hand or a tool and insert a cable or the like into a gap between the overlapping portions, thereby completing installation, and fire, a fastening member, or the like is not necessary, thus greatly improving workability of the installation of the cable at a site.

When the self-curling shielding tube 100 of FIG. 2 manufactured using the braided member 100' of FIG. 1 has an inner diameter of 9 mm and a cable having a diameter of 10 mm is accommodated therein, the cable may be stably covered with the self-curling shielding tube 100 due to restoring elasticity in a self-curling state without an additional fixing operation, when the cable is inserted between the overlapping portions O of the self-curling shielding tube 100 by separating the overlapping portions o from each other.

A 'bundle' refers to a fiber bundle or bunch consisting of a number of fine fiber yarns, and a bundle of carbon fiber yarn consists of a few thousand carbon fiber yarns.

There have been many attempts to use a carbon fiber (yarn) in various fields, because the mass of the carbon fiber (yarn) is only a quarter of that of iron but the strength and elasticity thereof are ten times and seven times those of iron, respectively. In the self-curling shielding tube 100 according to the present disclosure, carbon fiber yarn is applied as a shielding material that provides a shielding effect, and metal-plated carbon fiber yarn is applied to further improve an electromagnetic wave shielding effect.

The carbon fiber yarn of the present disclosure is preferably PAN-based carbon fiber yarn having an elongation of 1% or more. The PAN-based carbon fiber yarn has a diameter of 5 to 8 µm.

Generally, the carbon fiber yarn bundle 10 may be a bundle consisting of 1K (1,000) strands of carbon fiber yarn 11 or more, e.g., 3K (3,000), 6K (6,000) or 12K (12,000) strands of carbon fiber yarn 11. The present disclosure will be described herein mainly with respect to a braided member or the self-curling shielding tube 100 to which a carbon fiber yarn bundle consisting of 3K or 6K strands of carbon fiber yarn is applied.

For reference, a diameter or width of a 3K carbon fiber yarn bundle used in a test of the present disclosure was measured to be about 0.40 mm to 0.50 mm, and a diameter or width of a 6K carbon fiber yarn bundle used in the test was measured to be about 0.60 mm to 0.70 mm. Carbon fiber yarns are coated with polyamide during a manufacturing process to prevent the carbon fiber yarns from sticking to each other or being twisted together. A layer coated with polyamide is easily adhered to a surface of carbon fiber yarn and has high flexibility.

The braided member 100' and the self-curling shielding tube 100 according to the present disclosure are manufactured in a braided structure and basically include metal-plated carbon fiber yarn.

Carbon fiber yarn is a material that is light in weight and has rigidity and elasticity, and is plated with one or more metals to improve electromagnetic wave shielding performance.

Preferably, the carbon fiber yarn is plated with a metal such as copper, gold, silver, aluminum, nickel, or an alloy thereof, and has a density of 2.7 $g/cm^3$ or the less.

In an exemplary embodiment of the present disclosure, a carbon fiber may be double-plated by sequentially plating the carbon fiber with copper (Cu) and nickel (Ni).

The metal-plated carbon fiber yarns constituting the carbon fiber yarn bundle preferably have a plating thickness of 0.2 µm to 0.5 µm before weaving. A metal plating thickness of a carbon fiber yarn will be described in detail below.

The braided member 100' and the self-curling shielding tube 100 of the present disclosure may be manufactured by braiding the carbon fiber yarn bundles 10 including the metal-plated carbon fiber yarn 11 in the longitudinal direction and the shrinkage parts 20 including the plurality of shrinkage members 21, which are formed of a resin material and curl, i.e., are heat-shrinkable, when heated, in the circumferential direction, thereby maximizing the advantages of carbon fiber yarn, which is light in weight and has shielding performance, and providing convenience when used as finishing materials.

The braided member 100' formed of carbon fiber yarn of FIG. 1 according to the present disclosure may be manufactured by braiding the carbon fiber yarn bundles 10 in a direction (a first direction) and the shrinkage parts 20 in a direction (a second direction) perpendicular to the direction.

FIGS. 1 and 2 illustrate examples in which one shrinkage part 20 includes two shrinkage members 21, but one shrinkage part 20 may include one to five shrinkage members 21.

A polyolefin resin wire may be used as an example of the shrinkage member 21.

Polyolefin is a type of synthetic resin that is an organic material prepared by addition polymerization reaction of ethylene with olefin such as propylene (hydrocarbon containing a double bond per molecule).

Examples of polyolefin may include polyethylene (high-density polyethylene (HDPE), low-density polyethylene (LDPE), linear low-density polyethylene (LLDPE)), ethylene-vinylacetate copolymer (EVA), ultra-high molecular weight PE (UHMWPE), etc. In addition, polyolefin may include various types of polypropylenes (PP), rubber/elastomer (ethylene-propylene rubber), ethylene-propylene-diene monomer (EPDM), polyolefin elastomer (POE), ethylene/octene-1, etc.

Generally, polyolefin wire has elasticity, is insoluble in an organic solvent, is resistant to acids and bases, has an electrical insulation property, and thus is widely used as a material of a general heat-shrinkable tube.

The shrinkage parts 20 are configured with the shrinkage members 21, which are formed of a polyolefin material and provided in the form of polyolefin wire, and are woven to be arranged in the second direction perpendicular to the first direction. The shrinkage parts 20 may be arranged adjacent to each other in the second direction such that the shrinkage members 21 are aligned in the first direction.

To reduce weight or costs, the shrinkage members 21 are preferably arranged in a single layer and have a diameter of 0.25 mm to 0.5 mm.

To arrange the carbon fiber yarn bundles 10 in the longitudinal direction, the carbon fiber yarn bundles 10 may be spread in parallel and thereafter be woven or braided together.

A coating thickness of a coating layer may change when such metal-plated carbon fiber yarns are woven into bundles and the bundles are braided into a braided member. That is, it was confirmed that carbon fibers were broken due to friction between adjacent carbon fiber yarns or the like, thus causing fluffs, plating layers of the carbon fibers were damaged, or the thickness of the plating layers was likely to reduce when the metal-plated carbon fiber yarn was woven into bundles and the bundles were braided into a braided member.

Therefore, it is not preferable that a plating thickness of carbon fiber yarn is increased unconditionally to improve electromagnetic wave shielding performance. A method of setting an optimum plating thickness by taking into account the relationship between an electromagnetic wave shielding effect and the plating thickness will be described below.

Figure 3:
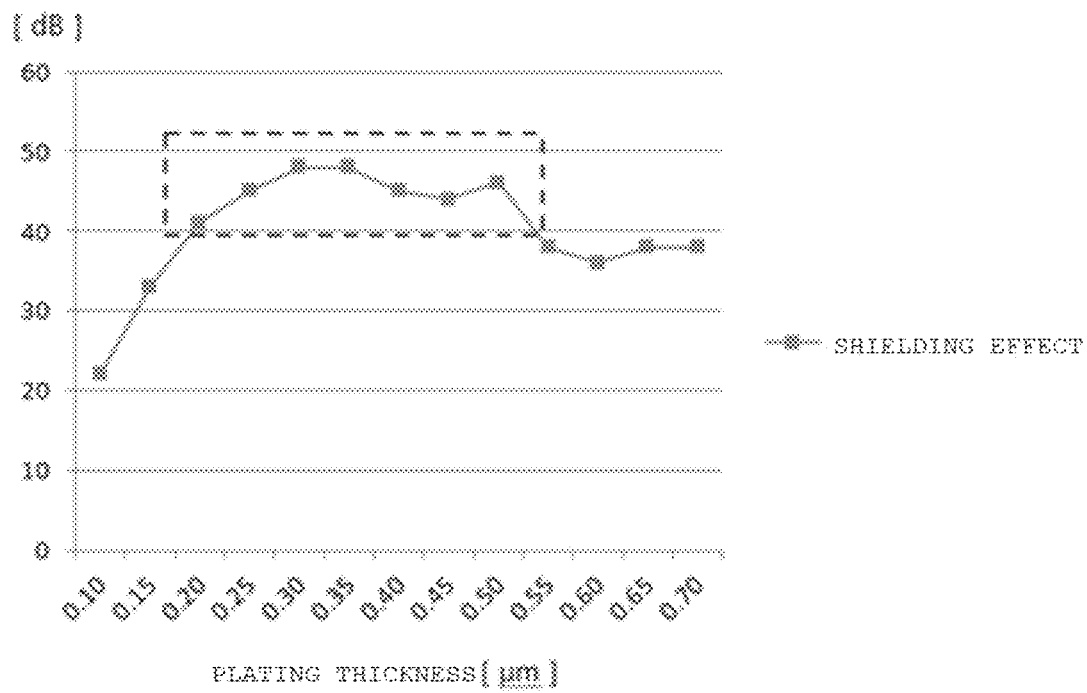
FIGS. 3 and 4 show results of an electromagnetic wave shielding performance test conducted on two types of carbon fiber yarn.
Figure 4:
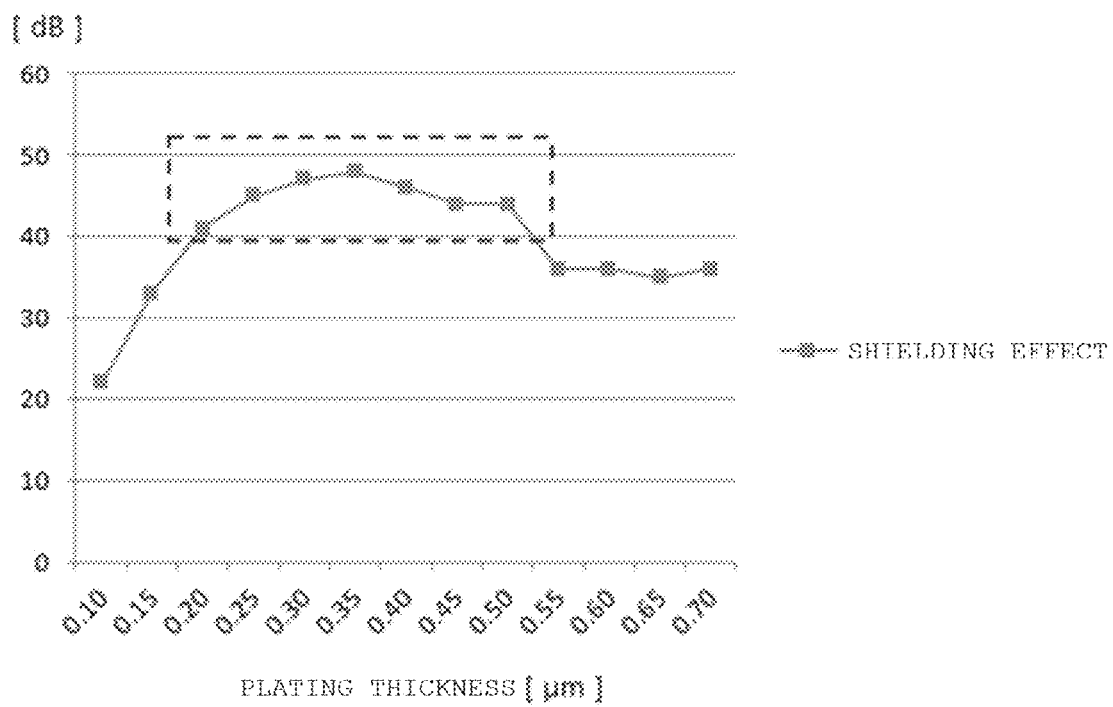

FIGS. 3 and 4 show results of an electromagnetic wave shielding performance test conducted on two types of carbon fibers.

FIGS. 3 and 4 illustrate electromagnetic wave shielding effects according to a metal plating thickness of 3K carbon fiber yarn and a metal plating thickness of 6K carbon fiber yarn.

In FIGS. 3 and 4, tests were conducted by covering 6K carbon fiber yarn and 3K carbon fiber yarn each having a metal plating thickness of 0.10 µm to 0.70 µm with a shielding material to be tested and measuring an electromagnetic wave shielding effect.

Specifically, in the tests of FIGS. 3 and 4, the 6K carbon fiber yarn and the 3K carbon fiber yarn were plated with a metal at a plating thickness of 0.05 µm, a shielding target cable was spirally covered with multiple non-woven or braided carbon fiber yarns and connected to measurement equipment, electric current was conducted through the cable, and a shielding factor was measured at a frequency of 100 MHz.

In the tests of FIGS. 3 and 4, the plating thickness of the metal-plated carbon fiber yarn was measured using a scanning electron microscope (SEM). Specifically, the thicknesses of three points on the metal-plated carbon fiber yarn were measured, and an average thereof was recorded as a plating thickness of a sample to be measured. The plating thickness was increased by 0.05 µm and a minimum plating thickness was set to 0.10 µm.

As both the metal plating thicknesses of the 6K carbon fiber yarn and the 3K carbon fiber yarn of FIGS. 3 and 4 increased, a shielding effect increased gradually, and when the plating thickness was 0.20 µm or more, shielding performance of 40 dB, which is generally considered as a reference value indicating high shielding performance, or more was achieved. In addition, an electromagnetic wave shielding factor was stably maintained at 40 dB or more until the plating thickness reached about 0.50 µm, but when the plating thickness exceeded 0.50 µm, the electromagnetic wave shielding factor reduced to be less than 40 dB.

The above results of the tests show that when a metal plating thickness was 0.10 µm or less, the electrical conductivity of a metal-plated layer was low, thus reducing the shielding effect, and a range of proportion between electromagnetic wave shielding performance of metal-plated carbon fiber yarn for electromagnetic wave shielding and a plating thickness was limited to a certain degree. When the thickness of the metal-plated layer was greater than 0.5 µm, the weight of the self-curling shielding tube 100 increased and thus the plating thickness was unnecessarily large.

Figure 5:
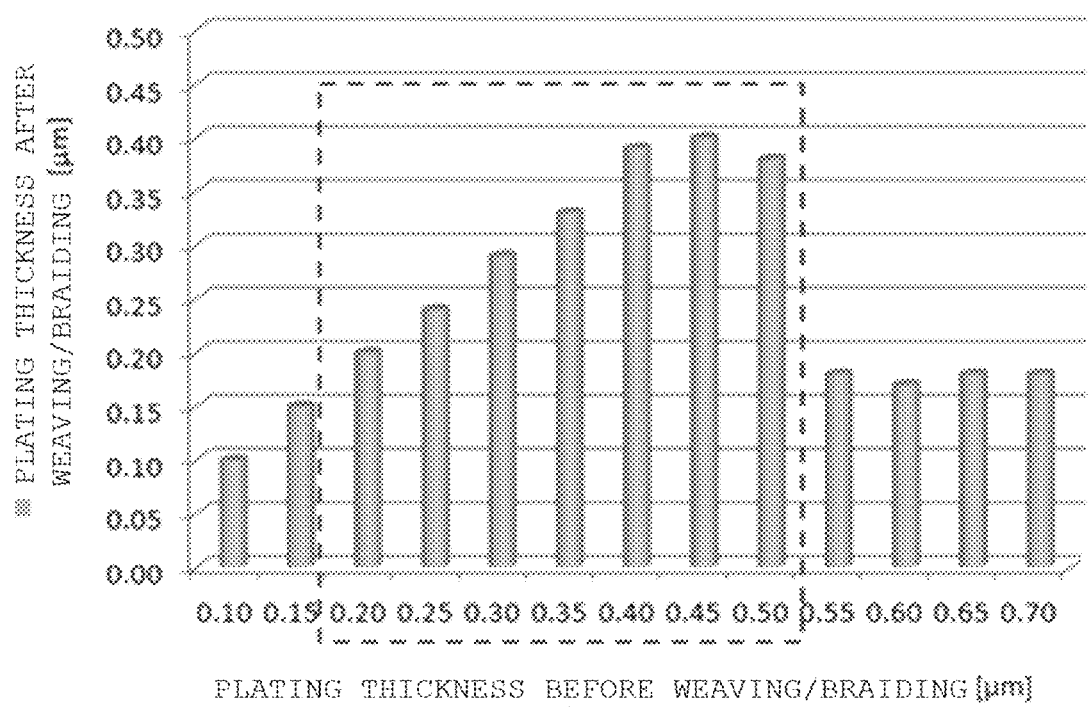
FIG. 5 shows a change of a plating thickness of 6K metal-plated carbon fiber yarn and a plating thickness of metal-plated carbon fiber yarn of a braided member formed by weaving and braiding the 6K metal-plated carbon fiber yarn or a self-curling shielding tube.

FIG. 5 shows a change of a plating thickness of 6K metal-plated carbon fiber yarn and a plating thickness of metal-plated carbon fiber yarn of a braided member formed by weaving and braiding the 6K metal-plated carbon fiber yarn or the self-curling shielding tube 100.

As shown in FIG. 5, as a result of measuring a plating thickness of carbon fiber yarn after a braided member as shown in FIG. 1 was woven by weaving the 6K carbon fiber yarn of FIG. 3, a metal plating thickness of the carbon fiber yarn of the woven and braided member increased proportionally until the plating thickness of the carbon fiber yarn reached 0.50 µm but was less than a plating thickness of the carbon fiber yarn before weaving or braiding and thus a metal-plated layer was damaged to a certain degree during weaving or braiding.

When the plating thickness of the carbon fiber yarn was greater than 0.50 µm, a metal plating thickness of the carbon fiber yarn of the braided member obtained by weaving and braiding was reduced by 50% or less, and particularly, to 0.20 µm or less.

Therefore, it is expected that as the plating thickness of the carbon fiber yarn increases, fluffs (broken pieces of the carbon fiber yarn) will increase due to friction or pressure during weaving or braiding and the plating thickness will reduce to be less than that before weaving or braiding due to separation of the plating layer.

Figure 6:
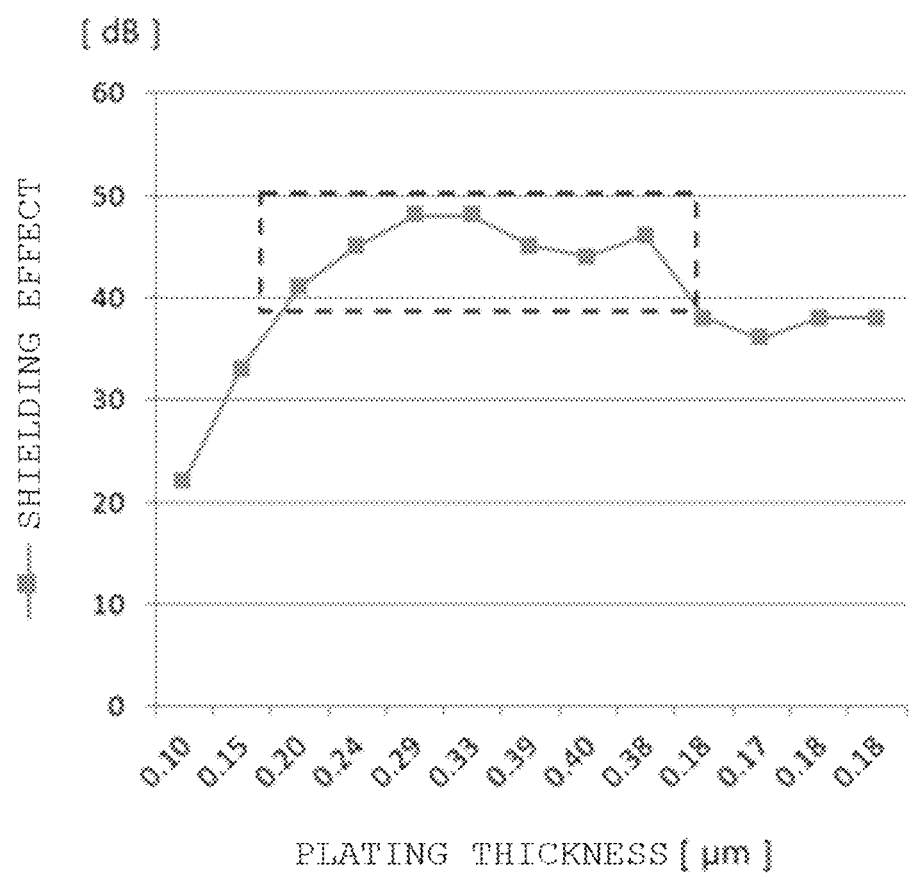
FIG. 6 shows a result of the electromagnetic wave shielding performance test conducted on the braided member of FIG. 5 or a self-curling shielding tube using the braided member.

FIG. 6 shows a result of the electromagnetic wave shielding performance test conducted on the braided member of FIG. 5 or the self-curling shielding tube 100 using the braided member.

As shown in the result of measuring a plating thickness of FIG. 5, a result of the electromagnetic wave shielding performance test conducted on the braided member of FIG. 6, which was woven with woven and braided metal-plated carbon fiber yarn, or the self-curling shielding tube 100 using the braided member reveals that the electromagnetic wave shielding effect gradually increased as a metal plating thickness was increased by 0.10 mm, a reduction of the electromagnetic wave shielding effect started when the metal plating thickness of the woven and braided carbon fiber yarn exceeded 0.40 mm, and therefore, shielding performance of 40 dB, which is a reference value indicating high shielding performance, or more was not achieved.

Accordingly, it was confirmed that as the plating thickness of the carbon fiber yarn and the electromagnetic wave shielding effect changed after a braided member as shown in FIG. 1 was woven by weaving the 6K carbon fiber yarn of FIG. 3, the plating thickness of 0.5 µm of the carbon fiber yarn before weaving and braiding was a boundary value of a plating thickness of 0.4 µm of the carbon fiber yarn after weaving and braiding and the electromagnetic wave shielding effect.

That is, when the self-curling shielding tube 100 for electromagnetic wave shielding was configured, a plating thickness of the carbon fiber yarn of a braided member after weaving and braiding or the self-curling shielding tube 100 using the braided member sharply reduced, thus reducing the electromagnetic wave shielding performance to be less than 40 dB, when a coating thickness of a metal-plated layer of the 6K carbon fiber yarn before weaving and braiding was set to be greater than 0.5 µm to improve electromagnetic wave shielding performance.

Table 1 below shows a change in a plating thickness of metal-plated carbon fiber yarn and a result of the electromagnetic wave shielding performance test according to the plating thickness when a braided member was formed by weaving and braiding the 6K metal-plated carbon fiber yarn of the present disclosure illustrated in FIGS. 5 and 6.

That is, Table 1 below shows that a thickness of a metal-plated layer did not reduce to a large extent during weaving and braiding when the plating thickness before weaving and braiding was in a range of 0.1 µm to 0.5 µm, because the plating thickness of the carbon fiber yarn before weaving and braiding and the plating thickness of the carbon fiber yarn after weaving and braiding were almost proportional to the electromagnetic wave shielding effect.

However, when the plating thickness of the carbon fiber yarn before weaving and braiding exceeded 50 µm, the plating thickness of the carbon fiber yarn after weaving and braiding reduced due to friction or the like and thus the plating thickness of the carbon fiber yarn before weaving and braiding should be 0.5 µm or less.

When the plating thickness of the carbon fiber yarn before weaving and braiding was less than 20 µm, a thickness of a plating layer did not reduce during weaving and braiding but a shielding effect of the woven and braided member or the self-curling shielding tube 100 was less than 40 dB and thus the thickness of the plating layer was insufficient.

Therefore, it may be concluded that the plating thickness of the 6K carbon fiber yarn before weaving and braiding is preferably in a range of 0.2 µm to 0.5 µm and a plating thickness of the 6K carbon fiber yarn after weaving and braiding is preferably in a range of 0.2 µm to 0.4 µm to prevent damage to the plating layer during weaving and braiding and achieve a high electromagnetic wave shielding effect.

TABLE 1

| before (6K) weaving/braiding plating thickness (µm) | after weaving/braiding plating thickness (µm) | shielding effect (dB) |
| --- | --- | --- |
| 0.10 | 0.10 | 22 |
| 0.15 | 0.15 | 33 |
| 0.20 | 0.20 | 41 |
| 0.25 | 0.24 | 45 |
| 0.30 | 0.29 | 48 |
| 0.35 | 0.33 | 48 |
| 0.40 | 0.39 | 45 |
| 0.45 | 0.40 | 44 |
| 0.50 | 0.38 | 46 |
| 0.55 | 0.18 | 38 |
| 0.60 | 0.17 | 36 |
| 0.65 | 0.18 | 38 |
| 0.70 | 0.18 | 38 |

Figure 7:
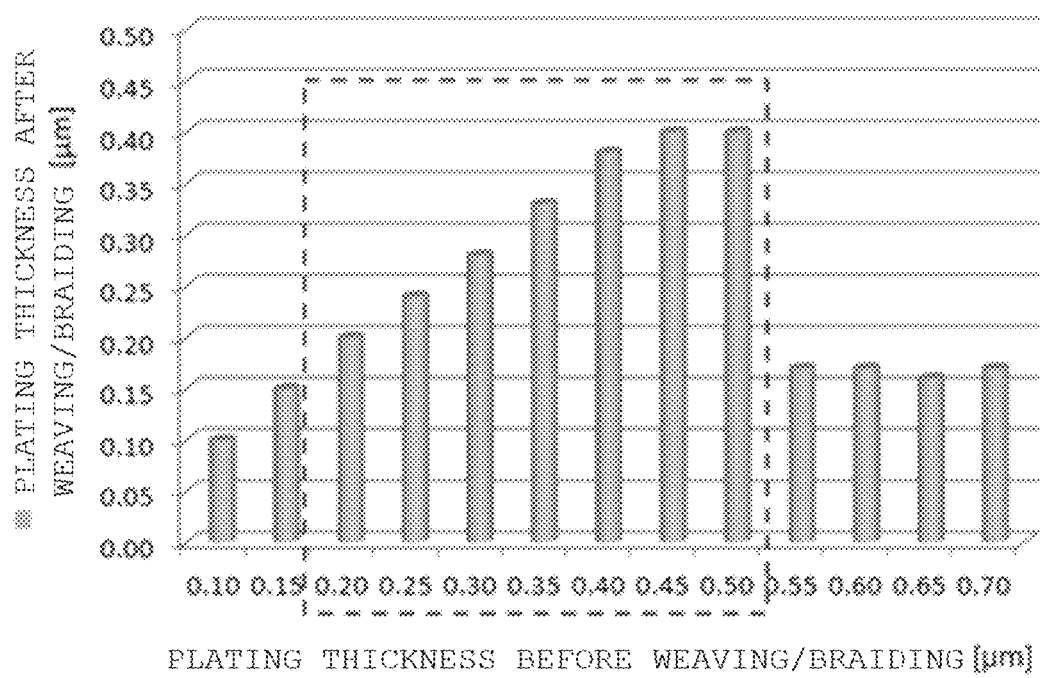
FIG. 7 shows a change of a plating thickness of 3K metal-plated carbon fiber yarn and a plating thickness of metal-plated carbon fiber yarn of a braided member formed by weaving and braiding the 3K metal-plated carbon fiber yarn or a self-curling shielding tube.
Figure 8:
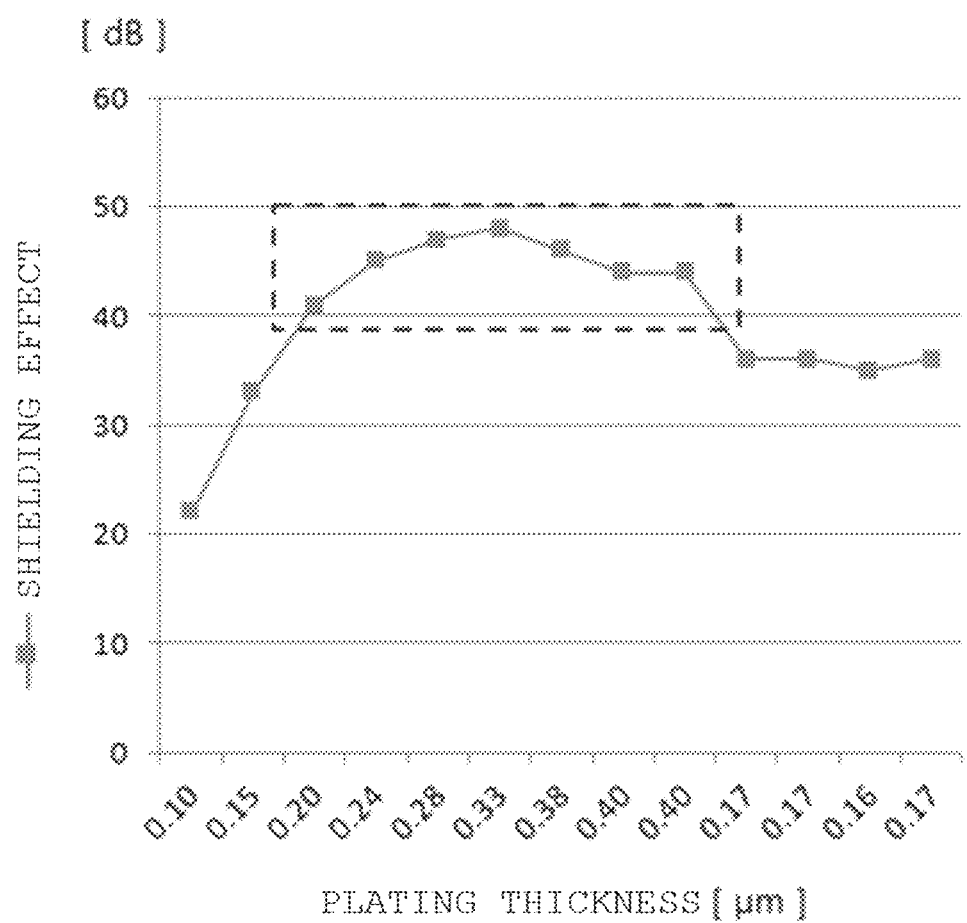
FIG. 8 shows a result of the electromagnetic wave shielding performance test conducted on the braided member of FIG. 7 or a self-curling shielding tube using the braided member.

FIG. 7 shows a change of a plating thickness of 3K metal-plated carbon fiber yarn and a plating thickness of metal-plated carbon fiber yarn of a braided member formed by weaving and braiding the 3K metal-plated carbon fiber yarn or the self-curling shielding tube 100. FIG. 8 shows a result of the electromagnetic wave shielding performance test conducted on the braided member of FIG. 7 or the self-curling shielding tube using the braided member. Table 2 below also shows a change in a plating thickness of metal-plated carbon fiber yarn and a result of the electromagnetic wave shielding performance test according to the plating thickness when a braided member was formed by weaving and braiding the 3K metal-plated carbon fiber yarn of the present disclosure. The results of the tests shown in FIGS. 7 and 8 and Table 2 reveal that similar to the 6K carbon fiber yarn, when the 3K carbon fiber yarn was applied, a plating thickness before weaving and braiding is preferably in a range of 0.2 µm to 0.5 µm and a plating thickness after weaving and braiding is preferably in a range of 0.2 µm to 0.4 µm to prevent damage to a plating layer during weaving and braiding and achieve a high electromagnetic wave shielding effect.

TABLE 2

| before (3K) weaving/braiding plating thickness (µm) | after weaving/braiding plating thickness (µm) | shielding effect (dB) |
| --- | --- | --- |
| 0.10 | 0.10 | 22 |
| 0.15 | 0.15 | 33 |
| 0.20 | 0.20 | 41 |
| 0.25 | 0.24 | 45 |
| 0.30 | 0.28 | 47 |
| 0.35 | 0.33 | 48 |
| 0.40 | 0.38 | 46 |
| 0.45 | 0.40 | 44 |
| 0.50 | 0.40 | 44 |
| 0.55 | 0.17 | 36 |

TABLE 2-continued

| before (3K) weaving/braiding plating thickness (μm) | after weaving/braiding plating thickness (μm) | shielding effect (dB) |
|---|---|---|
| 0.60 | 0.17 | 36 |
| 0.65 | 0.16 | 35 |
| 0.70 | 0.17 | 36 |

Figure 9:
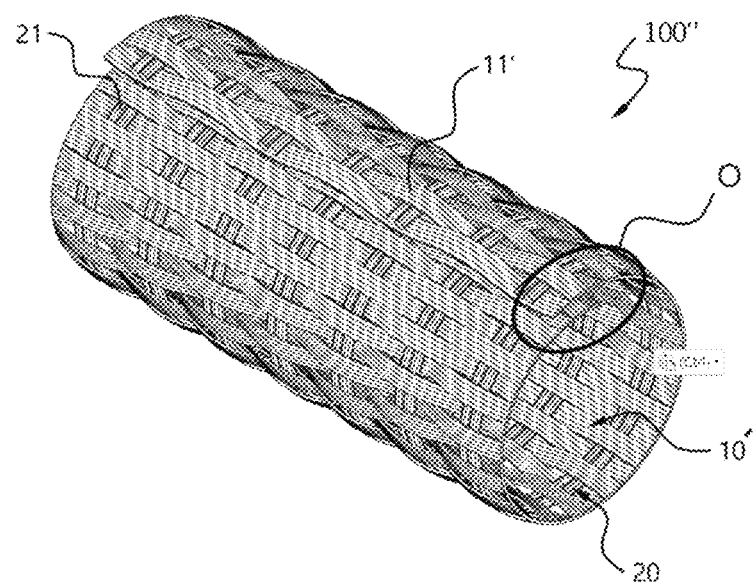
FIG. 9 is a perspective view of a self-curling shielding tube obtained by thermal contraction of a braided member in a tubular form, according to another embodiment of the present disclosure.

FIG. 9 is a perspective view of a self-curling shielding tube 100" obtained by thermal contraction of a braided member in a tubular form, according to another embodiment of the present disclosure. In the embodiment of FIG. 9, a carbon fiber yarn bundle is replaced with a metal wire bundle 10'. In this case, the metal wire bundle 10' may include a far smaller number of metal wires 11', e.g., several tens of metal wires 11', than in the previous embodiments.

As the metal wire 11', a conductor plated with copper, gold, silver, aluminum, nickel, an alloy thereof, or CCA. When the wire bundles 10' are configured as shown in FIG. 9, cable connection work may be simplified without using a method of rolling and welding a general metal braided member or the like, and an effect of reducing weight may be achieved due to a shrinkage part formed of a shrinkable resin material in the circumferential direction, as in the above-described embodiments.

While the present disclosure has been described above with respect to exemplary embodiments thereof, it would be understood by those of ordinary skilled in the art that various changes and modifications may be made without departing from the technical conception and scope of the present disclosure defined in the following claims. Thus, it is clear that all modifications are included in the technical scope of the present disclosure as long as they include the components as claimed in the claims of the present disclosure.

The invention claimed is:

1. A self-curling shielding tube comprising a braided member formed by braiding a plurality of carbon fiber yarn bundles and a plurality of shrinkage parts, the plurality of carbon fiber yarn bundles being obtained by weaving metal-plated carbon fiber yarn, and the plurality of shrinkage parts being disposed perpendicular to the plurality of carbon fiber yarn bundles and including a plurality of shrinkage members including wires formed of a heat-shrinkable polyolefin resin material, wherein:

the carbon fiber yarn bundles of the braided member are arranged in parallel in a longitudinal direction, the shrinkage parts are arranged in a direction perpendicular to the carbon fiber yarn bundles, and the braided member is formed in a cylindrical shape by thermal contraction and comprises overlapping portions overlapping in a circumferential direction;

each of the plurality of shrinkage members of the plurality of shrinkage parts has a diameter of 0.25 mm to 0.5 mm;

one to five shrinkage members are arranged in a single layer to form one shrinkage part;

the plurality of shrinkage parts are disposed to be spaced apart from one another in a lengthwise direction of the carbon fiber yarn bundles; and the metal-plated carbon fiber yarn of each of the plurality of carbon fiber yarn bundles has a plating thickness of 0.2 μm to 0.4 μm after weaving and braiding.

2. The self-curling shielding tube of claim 1, wherein each of the plurality of carbon fiber yarn bundles comprises 3K, 6K or 12K strands of carbon fiber yarn.

3. The self-curling shielding tube of claim 2, wherein the carbon fiber yarn of each of the plurality of carbon fiber yarn bundles comprises PAN-based carbon fiber yarn having an elongation of 1% or more.

4. The self-curling shielding tube of claim 1, wherein the metal-plated carbon fiber yarn is formed of copper, gold, silver, aluminum, nickel or an alloy thereof.

5. The self-curling shielding tube of claim 4, wherein the metal-plated carbon fiber yarn has a density of 2.7 g/cm$^3$ or less.

6. The self-curling shielding tube of claim 4, wherein the metal-plated carbon fiber yarn of each of the plurality of carbon fiber yarn bundles has a plating thickness of 0.2 mm to 0.5 mm before weaving.

7. The self-curling shielding tube of claim 1, wherein an overlapping range of the overlapping portions in the circumferential direction is a range of 20 to 50 degrees in a state of a cable is not inserted into the self-curling shielding tube.

8. A self-curling shielding tube comprising a braided member formed by braiding a plurality of carbon fiber yarn bundles and a plurality of shrinkage parts, the plurality of carbon fiber yarn bundles being obtained by weaving metal-plated carbon fiber yarn, and the plurality of shrinkage parts being disposed perpendicular to the plurality of carbon fiber yarn bundles and including a plurality of shrinkage members including wires formed of a heat-shrinkable polyolefin resin material, wherein:

the carbon fiber yarn bundles of the braided member are arranged in parallel in a longitudinal direction, the shrinkage parts are arranged in a direction perpendicular to the carbon fiber yarn bundles, and the braided member is formed in a cylindrical shape by thermal contraction and comprises overlapping portions overlapping in a circumferential direction; and the plurality of shrinkage parts are disposed to be spaced apart from one another in a lengthwise direction of the carbon fiber yarn bundles.

* * * * *